United States Patent
Park et al.

(10) Patent No.: US 9,203,055 B2
(45) Date of Patent: Dec. 1, 2015

(54) ORGANIC LIGHT EMITTING DISPLAY DEVICE AND METHOD OF MANUFACTURING THE SAME

(71) Applicant: LG DISPLAY CO., LTD., Seoul (KR)

(72) Inventors: Eun-Jung Park, Daegu (KR); Sang-Dae Kim, Paju-si (KR); Byung-Soo Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/132,237

(22) Filed: Dec. 18, 2013

(65) Prior Publication Data

US 2014/0183492 A1  Jul. 3, 2014

(30) Foreign Application Priority Data

Dec. 31, 2012  (KR) .................. 10-2012-0158142

(51) Int. Cl.
*H01L 51/52* (2006.01)
*H01L 51/00* (2006.01)

(52) U.S. Cl.
CPC ......... *H01L 51/5275* (2013.01); *H01L 51/0053* (2013.01); *H01L 51/5256* (2013.01)

(58) Field of Classification Search
CPC . H01L 51/50; H01L 51/0053; H01L 51/5256; H01L 51/5275
See application file for complete search history.

(56) References Cited

U.S. PATENT DOCUMENTS

| | | | |
|---|---|---|---|
| 2005/0157367 A1 | 7/2005 | Miyazawa | |
| 2006/0246811 A1* | 11/2006 | Winters et al. | 445/25 |
| 2006/0267001 A1* | 11/2006 | Hung | 257/40 |
| 2007/0267973 A1* | 11/2007 | Suh | 313/512 |
| 2009/0096359 A1* | 4/2009 | Lee et al. | 313/504 |
| 2010/0244011 A1 | 9/2010 | Moriya | |
| 2011/0127511 A1* | 6/2011 | Park et al. | 257/40 |
| 2012/0025225 A1 | 2/2012 | Oda | |
| 2012/0200221 A1* | 8/2012 | Inoue | 313/504 |
| 2012/0256202 A1 | 10/2012 | Lee et al. | |
| 2012/0319569 A1* | 12/2012 | Okamoto et al. | 313/504 |
| 2012/0326094 A1* | 12/2012 | Huh et al. | 252/500 |
| 2014/0299869 A1* | 10/2014 | Kugler et al. | 257/40 |

OTHER PUBLICATIONS

Office Action issued in United Kingdom Patent Application No. GB1321301.2, mailed Jun. 2, 2014, 6 pages.
Wan K. B. et al; Nanotechnology; IOP; Feb. 18, 2009; vol. 20; No. 7; p. 75202. "Deep blue light-emitting diodes based on Cd(1-x)Zn(x)S@ZnS quantum dots" ISSN: 0957-4484, 4 pages.
Office Action dated Jul. 21, 2015 for corresponding German Patent Application No. 10 2013 114 455.1, 11 pages.

* cited by examiner

*Primary Examiner* — Marc Armand
*Assistant Examiner* — Wasiul Haider
(74) *Attorney, Agent, or Firm* — Brinks Gilson & Lione (57) ABSTRACT

An organic light emitting display device includes a first electrode formed on a substrate, a second electrode facing the first electrode, a blue emission layer formed between the first and second electrodes, a capping layer formed on the second electrode, and a front sealing layer formed on the capping layer and comprising an inorganic barrier layer and an organic barrier layer alternately formed at least once, wherein a luminescent dopant included in the blue emission layer has a maximum photoluminescence wavelength of 465 nm or less, and blue light generated from the blue emission layer and emitted via the front sealing layer or the substrate has a Y color coordinate (CIEy) of 0.055 or less.

10 Claims, 9 Drawing Sheets

ORGANIC LIGHT EMITTING DISPLAY DEVICE AND METHOD OF MANUFACTURING THE SAME

This application claims the benefit of priority to Korean Patent Application No. 10-2012-0158142, filed on Dec. 31, 2012, which is hereby incorporated by reference as if fully set forth herein.

BACKGROUND

1. Field of the Disclosure

The present disclosure relates to an organic light emitting display device with high color reproducibility and high efficiency and a method of manufacturing the same.

2. Discussion of the Related Art

Organic light emitting display devices, which are one form of flat panel display device, are self-emissive devices and have faster response speed, higher luminous efficacy, higher luminance, and wider viewing angle than other flat panel display devices. An organic light emitting display device includes an anode, a cathode facing the anode, and an organic emission layer (EML) disposed therebetween. Holes injected from the anode and electrons injected from the cathode are recombined in the organic EML, forming excitons, which are electron-hole pairs and the excitons return to the ground state, thus releasing energy, whereby light is emitted.

As a method of enhancing optical efficiency by effectively extracting light emitted from an organic EML, microcavity using a capping layer is used. That is, due to differences in index of refraction between a capping layer and an external air layer disposed thereon, light generated from an EML undergoes repeated transmission and reflection between the capping layer and the external air layer. Accordingly, light with a particular wavelength is amplified and thus optical efficiency is enhanced. When a front sealing layer having a similar index of refraction to that of the capping layer is formed on the capping layer, however, cavity effects are reduced and thus it is difficult to properly display colors and efficiency is reduced.

SUMMARY

An organic light emitting display device includes a first electrode formed on a substrate, a second electrode facing the first electrode, a blue emission layer between the first and second electrodes, a capping layer on the second electrode, and a front sealing layer on the capping layer and comprising an inorganic barrier layer and an organic barrier layer alternately disposed at least once, wherein a luminescent dopant included in the blue emission layer has a maximum photoluminescence wavelength of 465 nm or less, and blue light generated from the blue emission layer and emitted via the front sealing layer or the substrate has a Y color coordinate (CIEy) of 0.055 or less.

In another aspect of the present invention, a method of manufacturing an organic light emitting display device includes forming a first electrode on a substrate, forming a blue emission layer on the first electrode, forming a second electrode on the blue emission layer, forming a capping layer on the second electrode, and forming a front sealing layer on the capping layer by alternately forming an inorganic barrier layer and an organic barrier layer at least once, wherein a luminescent dopant included in the blue emission layer has a maximum photoluminescence wavelength of 465 nm or less, and blue light generated from the blue emission layer and emitted via the front sealing layer or the substrate has a Y color coordinate (CIEy) of 0.055 or less.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EXEMPLARY EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Hereinafter, embodiments of the present invention will be described in detail with reference to the accompanying drawings and the following examples.

Figure 1:
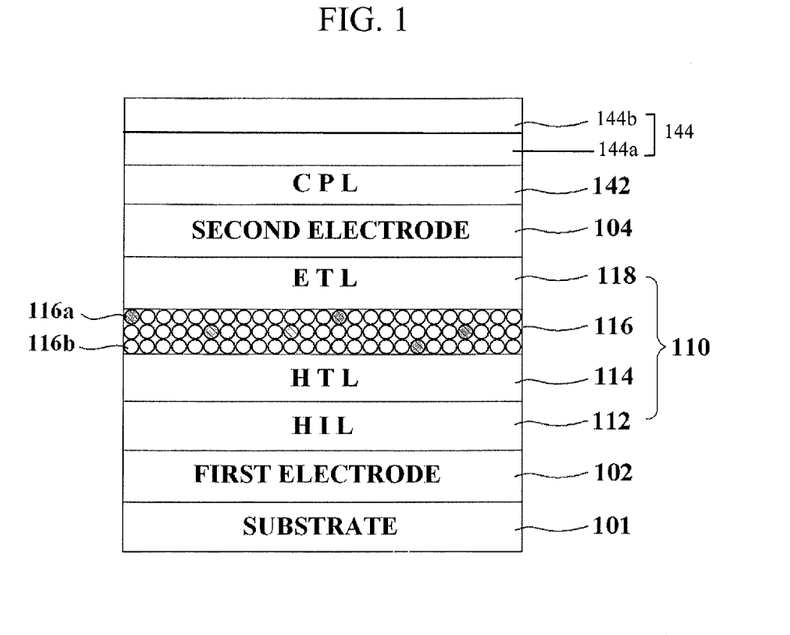
FIG. 1 is a sectional view of an organic light emitting display device according to an embodiment of the present invention.

FIG. 1 is a sectional view of an organic light emitting display device according to an embodiment of the present invention.

Referring to FIG. 1, the organic light emitting display device includes first and second electrodes 102 and 104 formed on a substrate 101, and an organic layer 110 formed between the first and second electrodes 102 and 104.

Any one of the first and second electrodes 102 and 104 is a semi-transparent electrode and the other thereof may is a reflective electrode. When the first electrode 102 is a semi-transparent electrode and the second electrode 104 is a reflective electrode, the organic light emitting display device is of a bottom emission type that emits light downward. On the other hand, when the second electrode 104 is a semi-transparent electrode and the first electrode 102 is a reflective electrode, the organic light emitting display device is of a top emission type that emits light upward. In the present invention, a case in which a reflective electrode is formed as the first electrode 102, which is an anode, and a semi-transparent electrode is formed as the second electrode 104, which is a cathode will be described by way of example.

The first electrode 102 has a multilayer structure including a metal layer formed of aluminum (Al) or an Al alloy (e.g., AlNd) and a transparent layer formed of indium tin oxide (ITO), indium zinc oxide (IZO), or the like and serves as a reflective electrode.

The second electrode 104 is formed of a single layer or multiple layers, and each layer constituting the second electrode 104 is formed of a metal, an inorganic material, a mixture of metals, a mixture of a metal and an inorganic material, or a mixture thereof. In this regard, when each layer is formed of a metal and an inorganic material, a mix ratio of metal to inorganic material is between 10:1 and 1:10. When each layer is formed of a mixture of metals, a mix ratio of the metals is between 10:1 and 1:10. The metal constituting the second electrode 104 may be Ag, Mg, Yb, Li, or Ca and the inorganic material thereof may be $Li_2O$, CaO, LiF, or $MgF_2$, which assist movement of electrons and thus enable many electrons to be supplied to the organic layer 110. The second electrode 104 has a thickness of 200 to 370 Å and prevents deterioration of transmittance. In particular, the second electrode 104 is a semi-transparent electrode having a transmittance of 20 to 50% according to type, thickness, rate, or the like of the second electrode 104. For example, when a maximum photoluminescence (PL) wavelength of a luminescent dopant included in a blue emission layer (EML) is 450 nm, the transmittance of the second electrode 104 is 22% or greater. When the maximum PL wavelength of a luminescent dopant included in a blue EML is 465 nm, the transmittance of the second electrode 104 is 20% or greater.

Between the first and second electrodes 102 and 104 are formed the organic layer 110 including a hole injection layer (HIL) 112, a hole transport layer (HTL) 114, a blue EML 116, and electron transport layer 118 that are sequentially stacked.

The HIL 112 facilitates injection of holes from the first electrode 102. The HTL 114 supplies holes from the HIL 112 to each of the EMLs (i.e., the blue EML 116). The ETL 118 supplies electrons from the second electrodes 104 to the blue EML 116.

The holes supplied via the HTL 114 and the electrons supplied via the ETL 118 are recombined in the blue EML 116 and thus blue light is generated. In particular, the blue EML 116 consists of a luminescent host 116a and a luminescent dopant 116b. The luminescent dopant 116b is formed so as to have a maximum PL wavelength of 465 nm or less, preferably between 450 and 465 nm. For example, the luminescent dopant 116b may be an anthracene-based dopant, a perylene-based dopant, a styrylamine-based dopant, or a deep blue dopant (e.g., a distyryl-amine dopant). Meanwhile, the maximum PL wavelength of the luminescent dopant 116b of 465 nm or less is a value obtained by measuring a blue EML in a solution state contained in a vessel prior to coating on a substrate or a value obtained by measuring a blue EML formed as a thin film formed by drying a blue EML in a solution state. As such, blue light that is generated from the blue EML 116 and emitted to the outside via the substrate 101 or the front sealing layer 144 has a Y color coordinate (CIEy) of 0.055 or less, preferably between 0.03 and 0.055.

A capping layer 142 is formed of a material having a higher index of refraction than an external air layer. Light having passed through the capping layer 142 is reflected from an interface between the capping layer 142 and the external air layer, and undergoes repeated reflection and transmission between the first electrode 104 and the capping layer 142, thereby being emitted to the outside via the capping layer 142. Accordingly, the amount of light loss due to total reflection from the interface between the capping layer 142 and the external air layer is reduced, and the amount of light transmitted increases, whereby luminous efficacy is enhanced. Wavelength bands of light emitted in red, green and blue sub-pixels differ and thus the capping layer 142 is formed so as to have a thickness corresponding thereto.

The front sealing layer 144 prevents permeation of external moisture or oxygen and thus enhances reliability. For this operation, the front sealing layer 144 has a structure in which organic barrier layers 144a and inorganic barrier layers 144b are alternately formed several times. The inorganic barrier layers 144b are formed of at least one of aluminum oxide ($Al_xO_x$), silicon oxide ($SiO_x$), $SiN_x$, SiON, and LiF so as to primarily prevent permeation of external moisture or oxygen. The organic barrier layers 144a secondarily prevent permeation of external moisture or oxygen. In addition, the organic barrier layers 144a alleviate stress between the layers according to bending of the organic light emitting display device and enhances planarization performance. The organic barrier layers 144a are formed of an acryl-based resin, an epoxy-based resin, or a polymer material such as polyimide or polyethylene. In particular, a difference in index of refraction between the capping layer 142 and the lowermost layer of the organic and inorganic barrier layers 144a 144b of the front sealing layer 144 is 0.2 or less, and the lowermost layer thereof has a thickness of 1 μm or greater.

Figure 2:
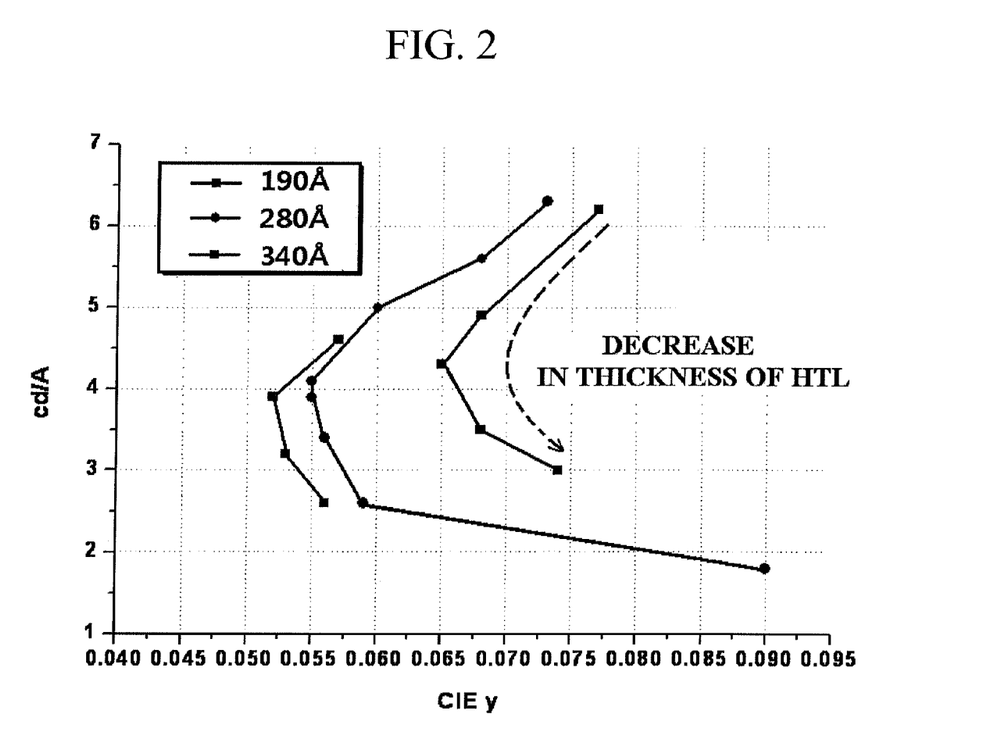
FIG. 2 is a graph for explaining efficiency and color characteristics according to the thickness of a second electrode of comparative examples and examples.

FIG. 2 is a graph for explaining efficiency and color characteristics according to the thickness of the second electrode 104 of comparative examples and examples.

As illustrated in FIG. 2, in the case of Comparative Example in which the second electrode 104 is formed to a thickness of 190 Å, when the thickness of the HTL 114 decreases, color is shifted towards short wavelengths from long wavelengths, a point of inflection is formed at a Y color coordinate (CIEy) of 0.065, and then color is shifted towards long wavelengths.

On the other hand, in the case of Example in which the second electrode 104 is formed to a thickness of 280 Å, when the thickness of the HTL 114 decreases, color is shifted towards short wavelengths from long wavelengths and then a point of inflection is formed at a lower Y color coordinate (CIEy) of 0.055 than that of Comparative Example and thus Example exhibits higher color reproducibility than Comparative Example. In addition, in the case of Example in which the second electrode 104 is formed to a thickness of 340 Å, when the thickness of the HTL 114 decreases, color is shifted towards short wavelengths from long wavelengths and then a point of inflection is formed at a lower Y color coordinate (CIEy) of 0.052 than that of Comparative Example and thus this example exhibits higher color reproducibility than Comparative Example. As such, when the second electrode 104 is formed to a thickness between 200 and 370 Å, the thickness of the second electrode 104 increases as compared to Comparative Example and thus the number of cavities increases, whereby color reproducibility is enhanced.

Figure 3A:
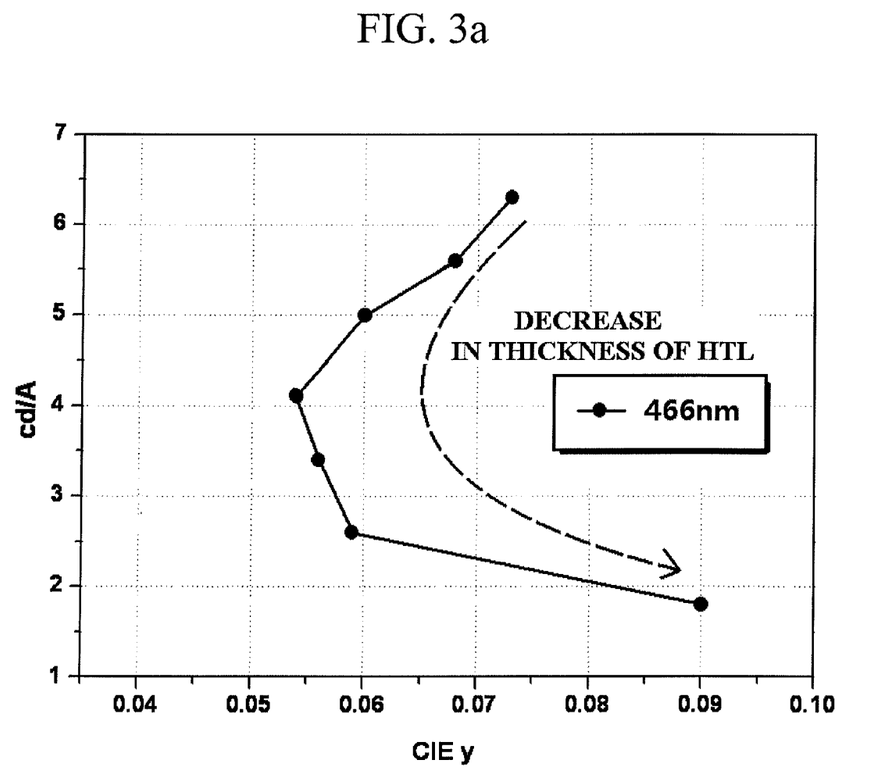
FIGS. 3A to 3C are graphs for explaining efficiency and color characteristics according to a maximum photoluminescence (PL) wavelength of a luminescent dopant of a blue emission layer (EML) according to Comparative Example and Example.
Figure 3B:
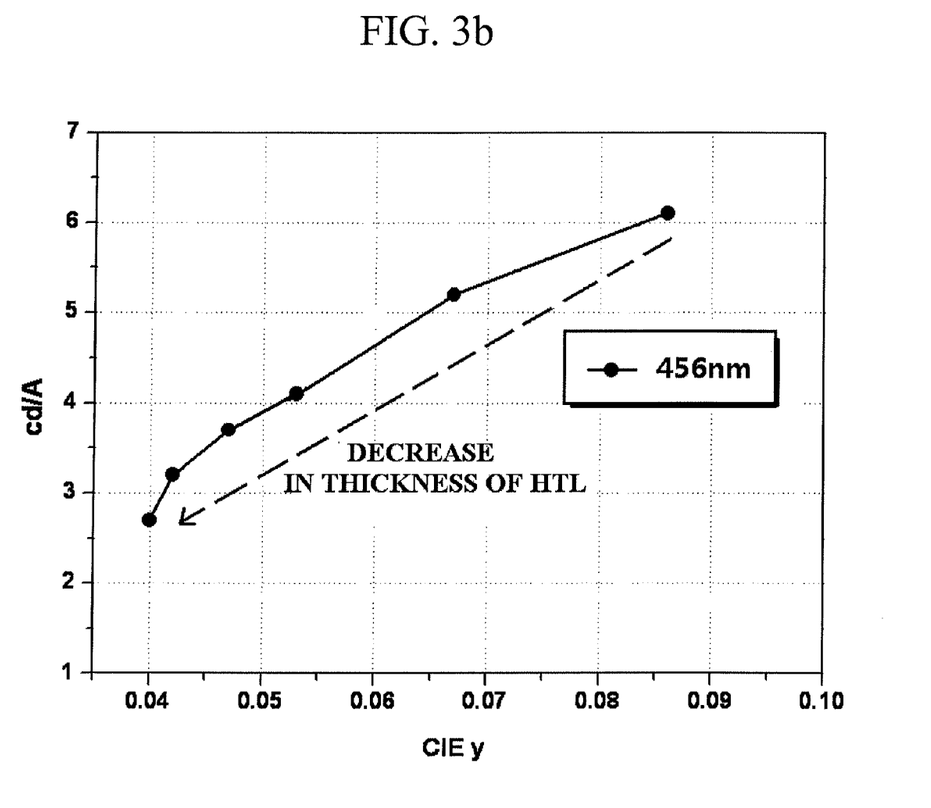
Figure 3C:
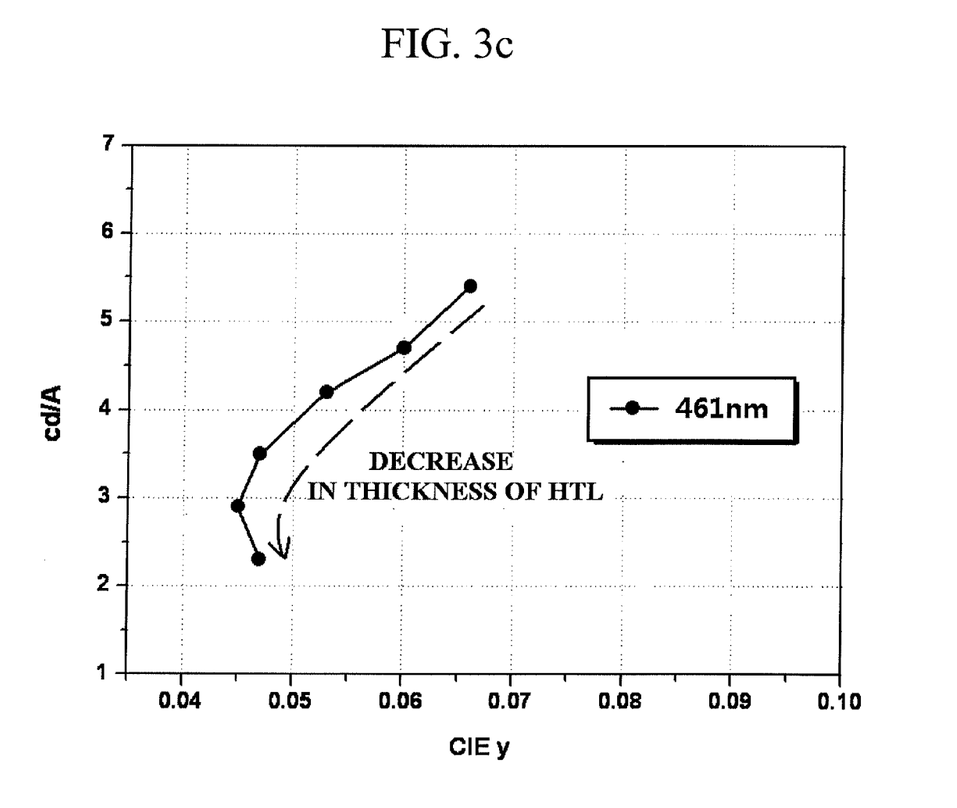

FIGS. 3A to 3C are graphs for explaining efficiency and color characteristics according to a maximum PL wavelength of the luminescent dopant 116b according to Comparative Example and Example.

As shown in FIG. 3A and Table 1 below, in the case of Comparative Example using a long-wavelength blue dopant as a luminescent dopant, when the thickness of the HTL 114 decreases, color is shifted towards short wavelengths from long wavelengths, a point of inflection is formed at a Y color coordinate (CIEy) of 0.055, and then color is shifted towards long wavelengths.

TABLE 1

Comparative Example

| PL (max) | Thickness of HTL (Å) | CIEy | Efficiency [cd/A] |
|---|---|---|---|
| 466 nm | 340 | 0.059 | 2.6 |
|  | 400 | 0.055 | 4.1 |
|  | 430 | 0.060 | 5.0 |
|  | 450 | 0.068 | 5.6 |
|  | 480 | 0.073 | 6.3 |

Accordingly, in Comparative Example, efficiency is low at short wavelengths, it is difficult to obtain high efficiency at long wavelength, and it is difficult to display colors with a Y color coordinate (CIEy) of 0.055 or less.

On the other hand, in the case of Example 1 using a deep blue dopant having a maximum PL wavelength of 456 nm as the luminescent dopant 116b, when the thickness of the HTL 114 decreases, as shown in Table 2 below and FIG. 3B, color is shifted towards short wavelengths from long wavelengths, there is no point of inflection of color, and color display is possible up to a Y color coordinate (CIEy) of 0.038.

TABLE 2

Example 1

| PL (max) | Thickness of HTL (Å) | CIEy | Efficiency [cd/A] |
|---|---|---|---|
| 456 nm | 340 | 0.038 | 2.5 |
|  | 400 | 0.041 | 3.1 |
|  | 430 | 0.047 | 4.0 |
|  | 450 | 0.051 | 5.6 |
|  | 480 | 0.062 | 5.8 |

In addition, in the case of Example 2 using a deep blue dopant having a maximum PL wavelength of 461 nm as the luminescent dopant 116b, when the thickness of the HTL 114 decreases, as illustrated in FIG. 3C, color is shifted towards short wavelengths from long wavelengths and a point of inflection is formed at a Y color coordinate (CIEy) of 0.048 that is lower than that in Comparative Example.

Accordingly, since Examples 1 and 2 use luminescent dopants having a maximum PL wavelength of 450 to 465 nm, lower efficiency at short wavelengths and higher efficiency at long wavelengths than in Comparative Example may be obtained, and a Y color coordinate (CIEy) of 0.055, which is a target color, may be achieved.

Color coordinates of points of inflection according to the maximum PL wavelength of the luminescent dopant are shown in Table 3 below and FIG. 4.

TABLE 3

Second electrode (thickness: 280 Å, transmittance of 34% or greater at maximum PL wavelength of 460 nm)

| Maximum PL wavelength of luminescent dopant | Y color coordinate (CIEy) of point of inflection |
|---|---|
| 466 nm | 0.055 |
| 461 nm | 0.048 |
| 456 nm | 0.041 |
| 451 nm | 0.034 |

Equation 1 below is a linear function for obtaining displayable colors according to the maximum PL wavelength of a blue dopant, produced based on Table 3 and FIG. 4.

$$Y = 0.055 - 0.0014(466 - X)$$ [Equation 1]

In Equation 1, Y denotes a Y color coordinate (CIEy) of displayable blue light and X denotes a maximum PL wavelength of a blue dopant.

Figure 4:
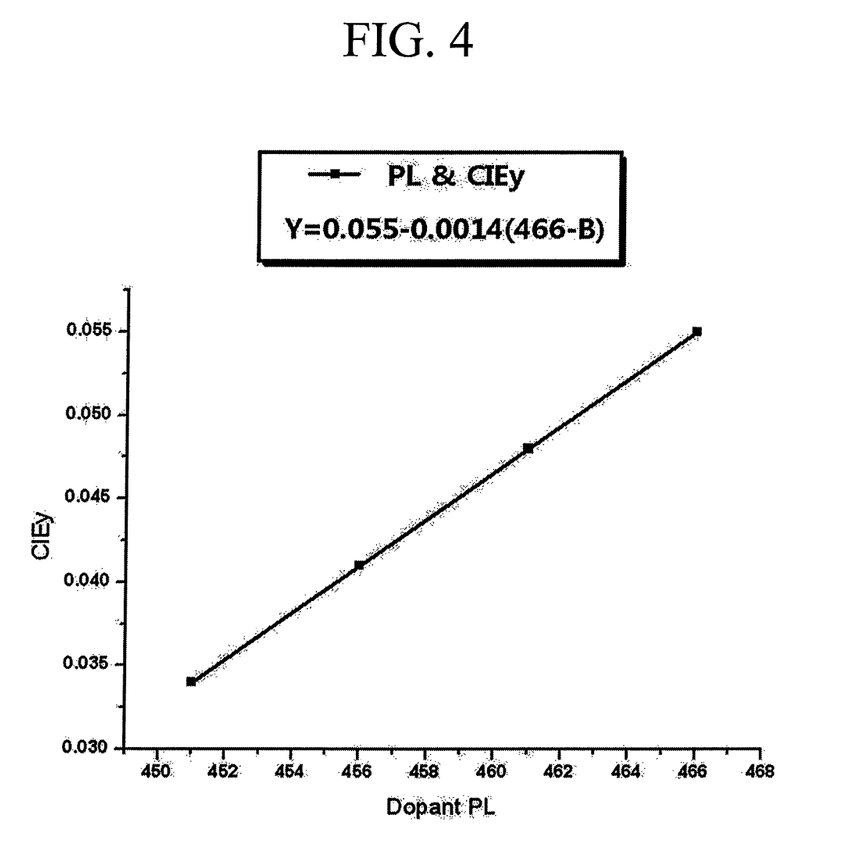
FIG. 4 is a graph for explaining displayable color characteristics according to the maximum PL wavelength of the luminescent dopant according to the present invention.

Meanwhile, in FIG. 4, when the thickness of the second electrode 104 exceeds 280 Å, transmittance decreases and thus slope increases. On the other hand, when the thickness of the second electrode 104 is less than 280 Å, transmittance is enhanced and thus slope decreases.

As shown in Table 4 below, it can be confirmed that organic light emitting display devices of Examples 1 and 2 using a deep blue dopant having a maximum PL wavelength of 450 to 465 nm as the luminescent dopant 116b and including the second electrode 104 having a thickness of 200 to 370 Å exhibit enhanced efficiency and color characteristics as compared to organic light emitting display devices of Comparative Examples 1 and 2 using, as a luminescent dopant, a blue dopant having a longer wavelength than that of the deep blue dopant.

TABLE 4

| Structure | Second electrode | Maximum PL wavelength of luminescent dopant | Y color coordinate (CIE_y) | Efficiency (cd/A) |
|---|---|---|---|---|
| Comparative Example 1 | AgMg (4:1) 280 Å | 466 nm | 0.055 | 4.1 |
| Comparative Example 2 | AgMg (4:1) 370 Å | 466 nm | 0.05 | 3.4 |
| Example 1 | AgMg (4:1) 280 Å | 456 nm | 0.041 | 3.7 |
| Example 2 | AgMg (4:1) 280 Å | 461 nm | 0.034 | 3.5 |

That is, as shown in Table 4, the organic light emitting display device of Comparative Example 2 including a second electrode having a greater thickness than that of a second electrode of the organic light emitting display device of Comparative Example 1 may have similar color characteristics to Examples 1 and 2. However, transmittance is reduced due to increase in the thickness of the second electrode and thus efficiency is reduced. In addition, deposition time of a metal, which is a material for forming the second electrode, increases when forming the second electrode and thus manufacturing time increases and the likelihood of occurrence of manufacturing defects increases. Moreover, viewing angle characteristics are deteriorated according to increase in cavities in red, green and blue sub-pixels as the thickness of the second electrode increases.

In addition, as in Examples 1 and 2, when a deep blue dopant having a maximum PL wavelength of 450 to 465 nm is used as the luminescent dopant 116b, the organic light emitting display devices of Examples 1 and 2 have enhanced color coordinate characteristics and efficiency as compared to those of Comparative Examples 1 and 2 as shown in Table 1.

Although the case in which the first electrode 102 is a reflective electrode and the second electrode 104 is a semi-transparent electrode has been described by way of example, a case in which the first electrode 102 is a semi-transparent electrode and the second electrode 104 is a reflective electrode may also be applied.

Figure 5:
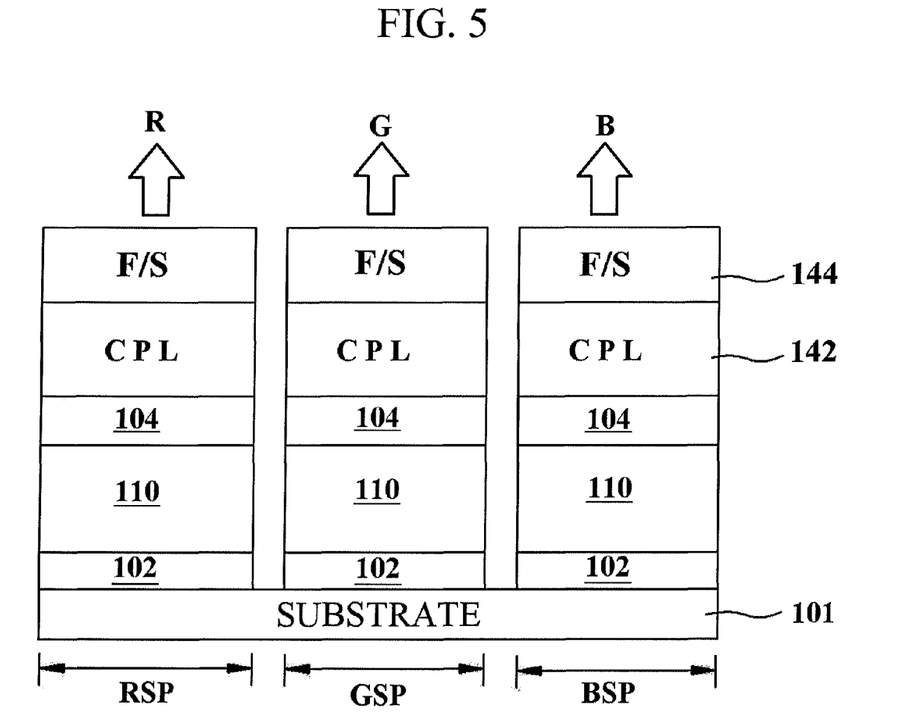
FIG. 5 is an organic light emitting display device including an organic layer including a blue EML illustrated in FIG. 1, according to an embodiment of the present invention.

The organic light emitting display device including the blue EML 116 may be applied to a structure illustrated in FIG.

5. In FIG. 5, a green sub-pixel (GSP) generates green light, a blue sub-pixel (BSP) generates blue light, a red sub-pixel (RSP) generates red light.

Figure 6:
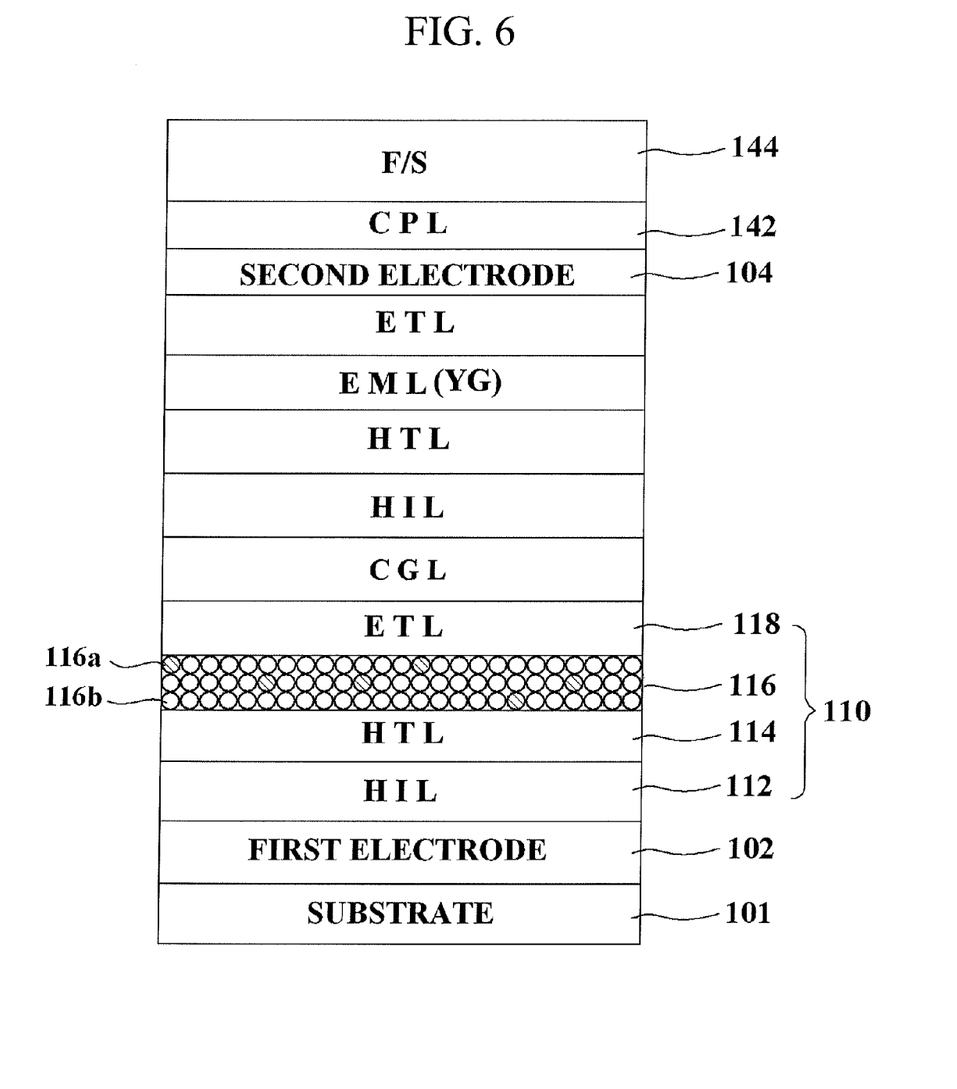
FIG. 6 is an organic light emitting display device including an organic layer including the blue EML illustrated in FIG. 1, according to another embodiment of the present invention.

In addition, although the organic light emitting display device having a single stack structure has been described, as illustrated in FIG. 6, the organic light emitting display device may have a multi-stack structure in which a charge generating layer (CGL) is disposed between a light emitting unit including the blue EML 116 and a light emitting unit including yellow and green EMLs.

Figure 7:
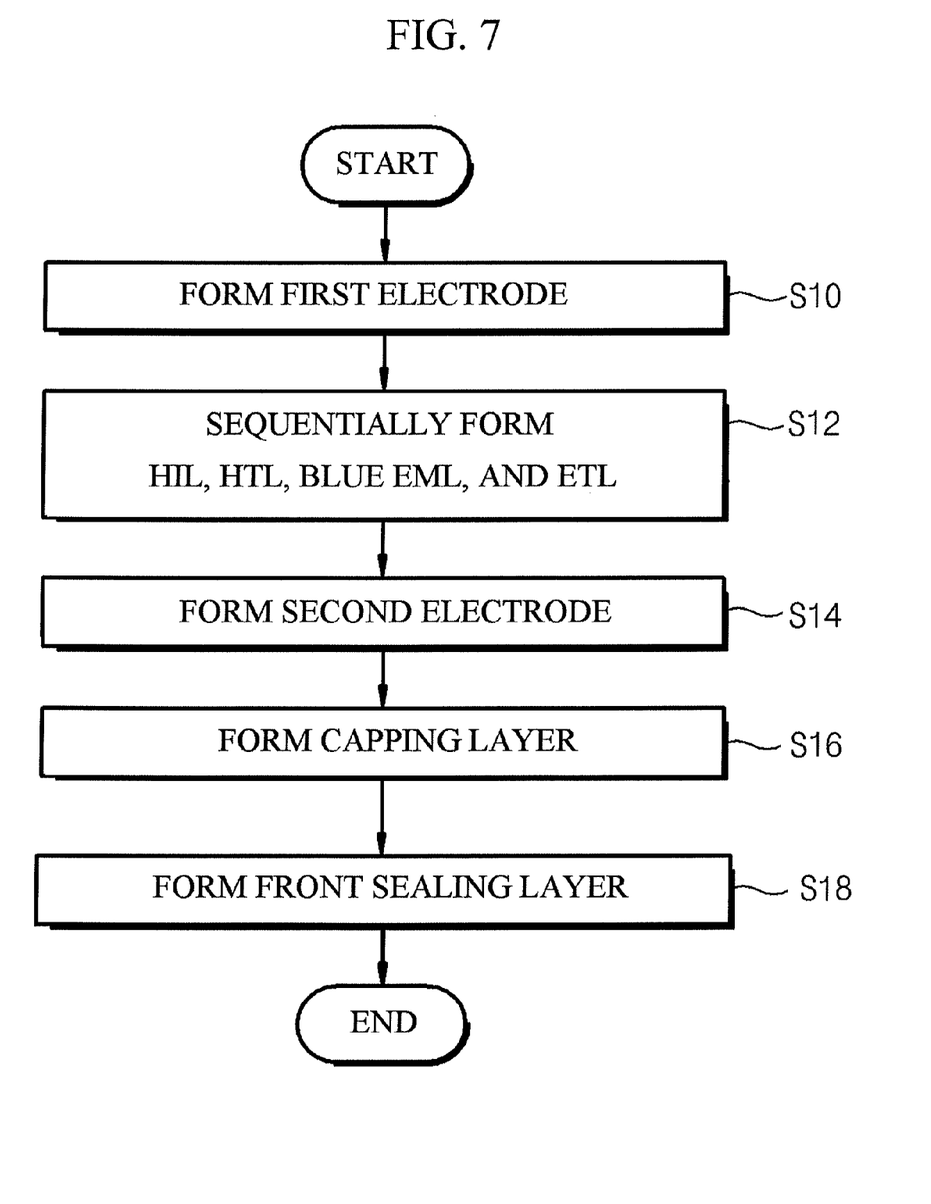
FIG. 7 is a flowchart for explaining an organic light emitting display device manufacturing method according to an embodiment of the present invention.

FIG. 7 is a flowchart for explaining an organic light emitting display device manufacturing method according to an embodiment of the present invention.

First, the first electrode 102 is formed on the substrate 101 (operation S10). The HIL 112, the HTL 114, the blue EML 116, and the ETL 118 are sequentially stacked on the substrate 101 with the first electrode 102 formed thereon by thermal deposition, sputtering, or a combination thereof to form the organic layer 110 (operation S12). In this regard, a deep blue dopant having a maximum PL wavelength of 450 to 465 nm is used as the luminescent dopant 116b included in the blue EML 116. Thereafter, the second electrode 104 is formed on the substrate 101 with the organic layer 110 formed thereon to a thickness of 200 to 370 Å (operation S14). The capping layer 142 is formed on the substrate 101 with the second electrode 102 formed thereon and the front sealing layer 144 is formed on the substrate 101 with the capping layer 142 formed thereon by alternately arranging an inorganic barrier layer and an organic barrier layer at least once (operations S16 and S18).

As is apparent from the foregoing description, in an organic light emitting display device according to the present invention, a luminescent dopant included in a blue EML formed below a front sealing layer is formed so as to have a maximum PL wavelength of 465 nm or less. Accordingly, the organic light emitting display device may realize blue light with excellent color characteristics and have enhanced luminous efficacy, which results in reduction in power consumption.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device comprising:
   a first electrode on a substrate;
   a second electrode facing the first electrode;
   a blue emission layer between the first and second electrodes;
   a capping layer on the second electrode; and
   a front sealing layer on the capping layer and comprising an inorganic barrier layer and an organic barrier layer alternately disposed at least once, the capping layer being disposed between and in direct contact with the second electrode and the front sealing layer;
   wherein a luminescent dopant included in the blue emission layer has a maximum photoluminescence wavelength of 450 nm to 465 nm,
   wherein a blue light generated from the blue emission layer and emitted via the front sealing layer or the substrate has a Y color coordinate (CIEy) of 0.055 or less,
   wherein any one of the first and second electrodes serves as a semi-transparent electrode having a transmittance of 20 to 50%, and the semi-transparent electrode has a thickness of 250 to 370 Å, and
   wherein a difference in index of refraction between the capping layer being in direct contact with the second electrode and a lowermost layer of the front sealing layer contacting the capping layer is 0.2 or less.

2. The organic light emitting display device according to claim 1, wherein the luminescent dopant is composed of a material selected from the group consisting of anthracene series, perylene series, styrylamine series, or distyryl-amine.

3. The organic light emitting display device according to claim 1, wherein the lowermost layer of the front sealing layer contacting the capping layer has a thickness of 1 μm or greater.

4. The organic light emitting display device according to claim 1, wherein the semi-transparent electrode is composed of a metal, an inorganic material, a mixture of metals, a mixture of a metal and an inorganic material, or a mixture thereof,
   the metal being selected from the group consisting of Ag, Mg, Yb, Li, or Ca, and the inorganic material being selected from the group consisting of $LiO_2$, CaO, LiF, or $MgF_2$.

5. The organic light emitting display device according to claim 1,
   wherein the blue light generated from the blue emission layer and emitted via the front sealing layer or the substrate has a Y color coordinate (CIEy) of 0.03 to 0.055.

6. A method of manufacturing an organic light emitting display device, the method comprising:
   forming a first electrode on a substrate;
   forming a blue emission layer on the first electrode;
   forming a second electrode on the blue emission layer;
   forming a capping layer on the second electrode; and
   forming a front sealing layer on the capping layer by alternately forming an inorganic barrier layer and an organic barrier layer at least once;
   wherein a luminescent dopant included in the blue emission layer has a maximum photoluminescence wavelength of 450 nm to 465 nm,
   wherein a blue light generated from the blue emission layer and emitted via the front sealing layer or the substrate has a Y color coordinate (CIEy) of 0.055 or less, and
   wherein any one of the first and second electrodes serves as a semi-transparent electrode having a transmittance of 20 to 50%, and the semi-transparent electrode has a thickness of 250 to 370 Å, and
   wherein a difference in index of refraction between the capping layer being in direct contact with the second electrode and a lowermost layer of the front sealing layer contacting the capping layer is 0.2 or less.

7. The method according to claim 6, wherein the luminescent dopant is composed of a material selected from the group consisting of anthracene series, perylene series, styrylamine series, or distyryl-amine.

8. The method according to claim 6, wherein the lowermost layer of the front sealing layer contacting the capping layer has a thickness of 1 μm or greater.

9. The method according to claim 6, wherein the semi-transparent electrode is composed of a material selected from the group consisting of a metal, an inorganic material, a mixture of metals, a mixture of a metal and an inorganic material, or a mixture thereof,
   the metal being selected from the group consisting of Ag, Mg, Yb, Li, or Ca, and the inorganic material being $LiO_2$, CaO, LiF, or $MgF_2$.

10. The method according to claim 6, wherein the blue light generated from the blue emission layer and emitted via the front sealing layer or the substrate has a Y color coordinate (CIEy) of 0.03 to 0.055.

* * * * *